United States Patent [19] [11] 4,007,047
Kaplan et al. [45] Feb. 8, 1977

| | | | |
|---|---|---|---|
| [54] | MODIFIED PROCESSING OF POSITIVE PHOTORESISTS | | |
| [75] | Inventors: | Leon H. Kaplan, Yorktown Heights; Steven M. Zimmerman, Wappingers Falls, both of N.Y. | |
| [73] | Assignee: | International Business Machines Corporation, Armonk, N.Y. | |
| [22] | Filed: | Dec. 10, 1975 | |
| [21] | Appl. No.: 639,536 | | |

Related U.S. Application Data

[63] Continuation of Ser. No. 476,831, June 6, 1974, abandoned.

[52] U.S. Cl. .................................. 96/36; 96/36.2; 96/49; 96/75; 96/91 D
[51] Int. Cl.² ....................... G03F 7/08; G03C 5/00
[58] Field of Search ............... 96/49, 75, 91 D, 33, 96/36, 35.1, 36.1, 36.2, 36.3; 156/13, 14

[56] References Cited

UNITED STATES PATENTS

| | | | |
|---|---|---|---|
| 2,958,599 | 11/1960 | Neugebauer | 96/91 D |
| 2,994,609 | 8/1961 | Landau | 96/91 D |
| 3,046,118 | 7/1962 | Schmidt | 96/91 D |
| 3,046,121 | 7/1962 | Schmidt | 96/91 D |
| 3,106,465 | 10/1963 | Neugebauer et al. | 96/91 D |
| 3,126,281 | 3/1964 | Sus et al. | 96/91 D |
| 3,173,788 | 3/1965 | Wimmer et al. | 96/49 |
| 3,201,239 | 8/1965 | Neugebauer et al. | 96/91 D |
| 3,264,104 | 8/1966 | Reichel | 96/33 |
| 3,406,065 | 10/1968 | Uhlig | 96/49 |
| 3,522,044 | 7/1970 | Hackmann | 96/36 |
| 3,533,796 | 10/1970 | Lassig et al. | 96/91 D |
| 3,592,646 | 7/1971 | Holstead et al. | 96/91 D |
| 3,637,644 | 1/1972 | Dunham et al. | 96/91 D |
| 3,779,778 | 12/1973 | Smith et al. | 96/33 |

OTHER PUBLICATIONS

Arcus et al., IBM Tech. Discl. Bulletin, vol. 15, No. 11, Apr. 1973, p. 3537.
Dinaburg, M. S., "Photosensitive Diazo Compounds," The Focal Press, 1964, pp. 31–46, and 181–196.
Chem. Abstracts, (I), vol. 60, No. 651h, 1964.
Chem. Abstracts, (II), vol. 69, No. 35074(d), 1968.
Gould, Edwin S., "Mechanism and Structure in Organic Chemistry," Holt et al., N.Y.C., 1959, pp. 346–353.

Primary Examiner—Charles L. Bowers, Jr.
Attorney, Agent, or Firm—David M. Bunnell

[57] ABSTRACT

Positive photoresist layers including a base soluble resin and a diazo ketone sensitizer are treated with hydrogen ion following initial exposure to achieve changes in the developed resist profile and/or development in a negative mode.

15 Claims, No Drawings

MODIFIED PROCESSING OF POSITIVE PHOTORESISTS

RELATED APPLICATION

This application is a continuation of application Ser. No. 476,831 filed June 6, 1974, now abandoned.

BACKGROUND OF THE INVENTION

A positive resist system in use today is composed of a base soluble polymer such as phenol-formaldehyde novolak resin and a photoactive compound containing diazo and keto groups at adjacent positions on the molecule. Such sensitizers and resists are described, for example, in U.S. Pat. Nos. 3,046,118; 3,046,121; 3,106,465; 3,201,239 and 3,666,473 which are hereby incorporated by reference. Exposure of the sensitizer is believed to convert the diazo keto configuration into a carboxyl group which, along with the hydroxyl groups of the novolak resin, causes the exposed material to be soluble in an alkaline solution. Negative resists, on the other hand, generally consist of a polymer with small amounts of a sensitizer which initiates cross-linking of the polymer upon exposure. The exposed material then becomes less readily soluble in developer solutions which are usually organic solvents. The two types of resists, therefore have been of necessity very different from each other in properties and behavior.

BRIEF SUMMARY OF THE INVENTION

A procedure has now been found which permits the base soluble resin-diazo ketone resist to be processed in the negative as well as the positive mode. The procedure also permits modification of the positive mode process to obtain resist profile changes which are advantageous in metal lift-off processing.

In accordance with the invention there is provided a photoresist process which includes the steps of providing a substrate with a layer of a light sensitive resist material which includes a base soluble resin and a diazo ketone sensitizer. The layer is exposed imagewise to radiation which will convert the diazo ketone to a base soluble form in the exposed portions of the layer. Following the exposure, the layer is treated with hydrogen ion. A relief image is developed to expose part of the surface of the substrate by removing portions of the resist layer with an alkaline developer solution.

In one aspect of the invention the entire resist layer is blanket exposed following the acid treatment to convert the previously unexposed portions to a base soluble form. The acid treatment renders the initially exposed portions less readily soluble in base and development of the layer results in a negative relief image.

In a second aspect of the invention, the development of the resist layer following the acid treatment, results in a steeper or undercut positive resist image profile which is advantageous for metal lift-off processing.

DETAILED DESCRIPTION

The foregoing and other objects, features and advantages of the invention will be apparent from the following more particular description of preferred embodiments of the invention.

The positive resists which are useful in the process of the invention include an alkali soluble resin. Examples of such resins are prepolymerized phenol-formaldehyde resins which can be prepared by the acid or base catalyzed condensation of formaldehyde with an excess of a phenol having the formula

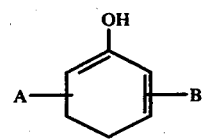

where (A) and (B) are selected from the group consisting of hydrogen and alkyl groups containing one to six carbon atoms.

Suitable sensitizers are diazo ketones having diazo and keto groups at adjacent positions on the molecule, such as the naphthoquinone-(1,2)-diazide sulfonic acid esters which are described in the above-referenced patents. Examples are described in U.S. Pat. No. 3,201,239 which have the general formula

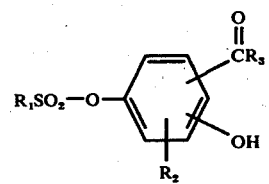

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups. Examples are also described in U.S. Pat. No. 3,046,118, which have the general formula;

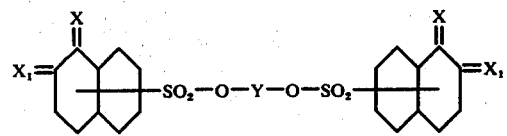

in which X and $X_1$ are $N_2$ or O, those attached to the same ring being different, and Y is an organic linkage containing at least one arylene, substituted arylene or heterocyclic radical; U.S. Pat. No. 3,046,121, which have the general formula;

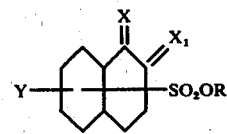

in which X and $X_1$ are selected from the group consisting of $N_2$ and O and are different. Y is selected from the group consisting of hydrogen and halogen and R is a substituted or unsubstituted aryl or heterocyclic radical: and U.S. Pat. No. 3,106,465 which have one of the general formulae;

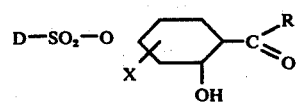

-continued

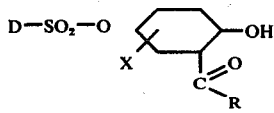

wherein D stands for a naphthoquinone-(1,2)-diazide radical, X stands for a member selected from the group consisting of H and OH. R stands for a member selected from the group consisting of hydrogen, $OR_1$, $NR_2R_3$, alkyl-, aryl- and heterocyclic radicals, $R_1$ stands for a member of the group consisting of alkyl and aryl, $R_2$ and $R_3$ stand for a member of the group consisting of hydrogen, alkyl and aryl, $R_2$ equalling $R_3$ or being different from $R_3$. Examples of such compounds are the 2,3,4-trihydroxybenzophenone esters of 1-oxo-2-naphthalene-5-sulfonic acid. The sensitizers are conventionally employed in amounts of from about 12 to 30% by weight of the resin components of the resist formulation.

The resist components are dissolved in an organic solvent or solvent mixture so that the resist can be coated as thin layers on various substrates. Suitable solvents include, for example, ethers, esters, and ketones such as methyl or ethyl cellosolve acetate, with or without minor amounts of butyl acetate and xylene; glycol monomethyl ether, glycol monoethyl ether; and aliphatic ketones such as methyl isobutyl ketone and acetone. The solids content of the resist solutions conventionally ranges from about 10 to 40% by weight.

According to conventional procedure, when the resist layer is exposed to actinic light, some of the sensitizer is converted from a base insoluble to a base soluble form. The adjacent diazo ketone groups are believed to form a carboxyl group which makes the exposed sensitizer molecules base soluble. A posative relief image is developed by treating the resist layer with an alkaline solution such as either an aqueous solution of a mixture of sodium metal silicate, sodium phosphate and sodium ortho phosphate or dilute NaOH which solutions preferentially remove the exposed portions of the layer.

According to the process of the invention, the exposed portions of the resist layer are converted to a form where they are again less readily soluble in base. This is accomplished by treating the layer with a solution containing hydrogen ion which acts to decarboxylate the exposed sensitizer molecules. Mildly acidic solutions have been found to be useful in accomplishing the change in solubility. For example, dilute aqueous mineral acid solutions such as HCl and $H_2SO_4$.

The aspect of the invention in which the normally positive resist is developed in the negative mode starts with applying the resist to a substrate and prebaking in a conventional layer. The resist is then exposed patternwise to actinic radiation to an extent sufficient to convert a major portion of the sensitizer to a base soluble form. This is generally somewhat greater than normal exposure and preferably the exposure is chosen on the high side to assure sufficient conversion of the sensitizer. The substrate with its exposed resist film is then dipped into a hot, mildly acidic solution such as dilute sulfuric or hydrochloric acid. Concentrations of from about 2–10 moles/liter of $H^+$ ion have been successfully employed but this range should not be regarded as being restrictive. Following the acid treatment, the resist layer is re-exposed without masking to the same or greater extent as the first exposure. The resin coated substrate is then immersed in the conventional, mildly alkaline developing solution until the pattern in the resist layer is developed. Because the acid treatment has reduced the base solubility of the originally exposed areas, these areas remain intact. The originally unexposed areas, which were unaffected by the acid treatment, were converted to alkaline solubility during the second exposure such that these areas are preferentially removed by base. A negative image results.

The above procedure is further illustrated by, but is not intended to be limited to, the following Examples wherein parts are parts by weight unless otherwise indicated.

EXAMPLE 1

A thermally oxidized silicon substrate, having about an 11,000 A thick oxide layer, is coated with a layer of photoresist about 8,000 A thick by spinning at 4,000 rmp. The resist contains about 31 percent by weight solids of which about 75% is a cresol-formaldehyde novolak resin and about 25% is a diazo-ketone sensitizer which is the 1-oxo-2-diazo-naphthalene-5-sulfonic acid ester of 2,3,4-trihydroxybenzophenone. The resist solvent is a mixture of about 80 percent cellosolve acetate, 10 percent n-butyl acetate and 10 percent xylene. Three parts of resist solution are diluted with an additional part of solvent before spinning on the substrate. The coated resist layer is then baked for about 15 minutes on a hotplate at a temperature of about 85° C. The prebaked resist layer is then exposed through a pattern mask to a source of actinic radiation for 60 seconds with the source having a power of 9 milliwatts/cm² over the wavelength range 4075 ± 750 A. The substrate is then dipped for four minutes in aqueous HCl (37% HCl diluted 1 part acid and 4 parts water) at a temperature of about 90° C. The substrate is then rinsed in deionized water, air dried and baked at about 85° C for 30 minutes. The resist layer is then re-exposed without a mask (blanket exposure) for 60 seconds to the 9mw/cm² light source. The resist layer is developed for about 10 seconds in a conventional aqueous alkaline developer solution which has a pH of about 12.8 and which contains about 2.5% by weight of a mixture of sodium meta-silicate, sodium ortho phosphate and sodium hydrogen phosphate. The developed resist layer is then rinsed in deionized water and dried. The originally unexposed portions of the layer are removed by the development to produce a negative resist image.

When the patterned resist layer is processed by the blanket evaporation of a metal such as aluminum followed by removal of the resist and overlying metal to leave a patterned layer of aluminum adhered to the substrate (lift-off process) excellent results are obtained. This is believed to be due to a resist edge profile which is steeper than normal or even undercut by using the process of the invention.

EXAMPLE 2

A negative resist pattern was obtained, with little or no loss of resist thickness in the retained portions, by repeating the process of Example 1 except that the acid treatment was carried out using a dilute $H_2SO_4$ solution, which was 20% by volume concentrated $H_2SO_3$ in water, for four minutes at about 90° C.

The following example illustrates the process of the invention in which improved resist profiles for lift-off processing are obtained in positive image development.

EXAMPLE 3

Silicon wafers were oxidized to obtain about 11,000 A of thermal $SiO_2$. The wafers were first vapor coated with a layer of the adhesion promoter, hexamethyldisilazine and coated with a layer of positive resist as described in Example 1. The resist layers were baked for 15 minutes at about 85° C and exposed through a pattern mask for 8 seconds to the 9mw/cm² light source. A number of wafers were subjected to treatment in 20% by volume $H_2SO_4$ at a temperature of about 90° C for from 2–3 minutes. The remaining wafers served as a control. The acid treated wafers were developed for from one to three minutes in an alkaline developer containing about twice the solids content of the developer used in Example 1. The remaining control wafers were developed in the developer for 45 seconds. The patterned resist thickness was about 8,000 A.

An acid treated and a control wafer were placed in an evaporator and each was coated with a 4,000 A thick layer of aluminum. Other metals or alloys having good conductivity could also be used. The wafers were then placed in acetone to remove the resist and overlying metal portions. Low magnification views of sites on each wafer were made and examined. It was noted that some apparent lift-off occurred in the control sample but only at the expense of adhesion failure of the aluminum and removal of areas where the aluminum was in contact with the substrate surface. The acid treated sample, on the other hand, appears to give an excellent pattern. The difference in lift-off results is not precisely understood but it is believed to be due to a favorable modification of the resist profile. The acid treatment is believed to create a gradient of decarboxylation through the pattern-exposed resist layer. Upon development of the resist layer, the rate of solubility increases with depth so that lateral development proceeds more quickly nearer the substrate to give a steeper or even an undercut relief profile.

The process of the invention permits a single resist to be used in both the positive and negative modes depending upon the optimum mode for any given application. For example, in typical integrated circuit manufacturing operations such as etching contact holes through insulating oxide layers, it is desirable to avoid the effects of pinholes in the opaque areas of the exposure masks. In this case, the resist can be used in the negative mode, because the pinholes will occur in the areas to be opened and will not effect the insulating ability of the oxide. On the other hand, for sub-etching metal lines, the resist can be used in the conventional positive mode to place pinholes in the mask over areas of metal to be left, rather than between lines, where shorts due to bridging could occur.

While the invention has been particularly shown and described with reference to preferred embodiments thereof, it will be understood by those skilled in the art that the foregoing and other changes in form and details may be made therein without departing from the spirit and scope of the invention.

We claim:
1. A photoresist process comprising the steps of:
   a. providing on a substrate a layer of a light sensitive resist material consisting essentially of an alkali soluble phenolformaldehyde resin and a naphthoquinone-(1,2)-diazide sulfonic acid ester sensitizer;
   b. exposing said layer imagewise to radiation with sufficient energy to convert a majority of said diazo ketone to a alkali soluble form in the exposed portion of said layer;
   c. treating said layer, following said exposure, with a mildly acidic aqueous solution;
   d. exposing the entire layer with actinic radiation; and then
   e. developing a negative relief image of resist on said substrate by removing the initially unexposed portions of said layer with an alkaline developer solution.
2. The process of claim 1 wherein said sensitizer is selected from the compounds having the following general formulae

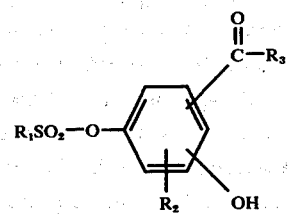

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups;

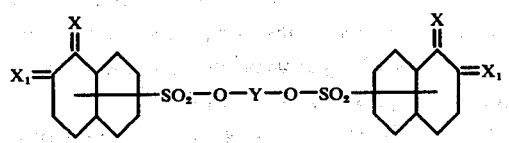

in which X and $X_1$ and $N_2$ or O, those attached to the same ring being different, and Y is an organic linkage containing at least one arylene, substituted arylene or heterocyclic radical;

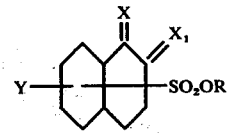

in which X and $X_1$ are selected from the group consisting of $N_2$ and O and are different: Y is selected from the group consisting of hydrogen and halogen and R is a substituted or unsubstituted aryl:

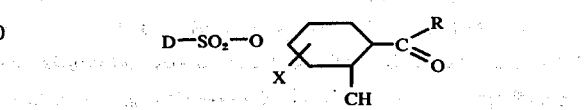

wherein D stands for a naphthoquinone-(1,2)-diazide radical, X stands for a member selected from the group consisting of H and OH: R stands for a member selected from the group consisting of hydrogen, $OR_1$, $NR_2R_3$, alkyl-, aryl- and heterocyclic radicals, $R_1$ stands for a member of the group consisting of alkyl and aryl, $R_2$ and $R_3$ stand for a member of the group consisting of hydrogen, alkyl and aryl, $R_2$ equalling $R_3$ or being different from $R_3$.

3. The process of claim 2 wherein said diazo ketone is a 2,3,4-trihydroxybenzophenone ester of 1-oxo-2-diazo-naphthalene-5-sulfonic acid.

4. The process of claim 1 wherein said acid is an aqueous mineral acid.

5. The process of claim 1 wherein said acid treatment includes immersing said layer in a hot aqueous mineral acid solution so that the exposed diazo ketone molecules are decarboxylated.

6. In the method of making a positive resist image by providing on a substrate a layer of photosensitive material including an alkali soluble phenolformaldehyde resin and a naphthoquinone-(1,2)-diazide sulfonic acid ester sensitizer and exposing said layer imagewise to radiation which changes the solubility characteristics of the exposed portions such that a positive relief image can be developed in said layer by treating said layer with an alkali developer; the improvement which comprises treating said layer, following said exposure, with a mildly acidic, aqueous solution, so as to cause decarboxylation of a portion of the exposed sensitizer and reduce its alkali solubility, and subsequent to treating said layer with said solution, removing the exposed portion of said layer with said alkaline developer to produce an undercut resist profile.

7. The method of claim 6 in which said resin is a phenolformaldehyde resin.

8. The method of claim 6 in which the sensitizer is a compound selected from compounds having the following general formulae;

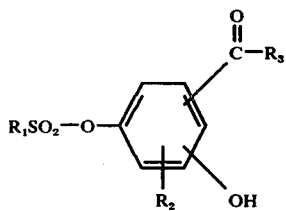

in which $R_1$ is a naphthoquinone-(1,2)-diazide radical, $R_2$ is selected from the group consisting of hydrogen and hydroxyl, and $R_3$ is selected from the group consisting of hydrogen, alkyl, aryl, alkoxy, aryloxy, amino, and heterocyclic groups;

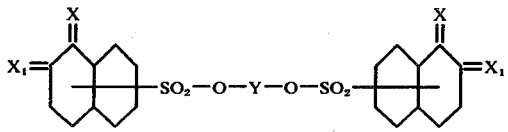

in which X and $X_1$ are $N_2$ or O, those attached to the same ring being different, and Y is an organic linkage containing at least one arylene, substituted arylene or heterocyclic radical;

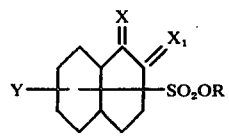

in which X and $X_1$ are selected from the group consisting of $N_2$ and O and are different; Y is selected from the group consisting of hydrogen and halogen and R is a substituted or unsubstituted aryl:

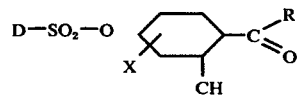

wherein D stands for a naphthoquinone-(1,2)-diazide radical, X stands for a member selected from the group consisting of H and OH: R stands for a member selected from the group consisting of hydrogen, $OR_1$, $NR_2R_3$, alkyl-, aryl- and heterocyclic radicals, $R_1$ stands for a member of the group consisting of alkyl and aryl, $R_2$ and $R_3$ stand for a member of the group consisting of hydrogen, alkyl and aryl, $R_2$ equalling $R_3$ or being different from $R_3$.

9. The method of claim 6 wherein said sensitizer is a 2,3,4-trihydroxybenzophenone ester of 1-oxo-2-diazonaphthalene-5-sulfonic acid.

10. The method of claim 6 wherein said acid is an aqueous mineral acid.

11. The method of claim 6 wherein said treatment with acid includes immersing said layer in a hot aqueous mineral acid solution.

12. The method of claim 6 including the steps of forming a layer of material over the resist image and the substrate and then removing the resist image and the overlying portions of said material to leave the substrate with a patterned layer of said material in contact with said substrate.

13. The method of claim 15 wherein said material is a metal.

14. The process of claim 1 including the steps of forming a layer of material over the relief image and substrate and then removing the resist image and overlying portions of material to leave the substrate with a patterned layer of material in contact with said substrate.

15. The process of claim 14 wherein said material is a metal.

* * * * *

UNITED STATES PATENT OFFICE
CERTIFICATE OF CORRECTION

PATENT NO. : 4,007,047

DATED : February 8, 1977

INVENTOR(S) : Leon H. Kaplan and Steven M. Zimmerman

It is certified that error appears in the above-identified patent and that said Letters Patent are hereby corrected as shown below:

Column 6, line 43   "and" (second occurrence) should be --are--

Signed and Sealed this

Third Day of May 1977

[SEAL]

Attest:

RUTH C. MASON
*Attesting Officer*

C. MARSHALL DANN
*Commissioner of Patents and Trademarks*